United States Patent [19]

Takada et al.

[11] Patent Number: 4,914,815

[45] Date of Patent: Apr. 10, 1990

[54] METHOD FOR MANUFACTURING HYBRID INTEGRATED CIRCUITS

[75] Inventors: Mitsuyuki Takada; Hayato Takasago; Yoshiyuki Morihiro, all of Amagasaki, Japan

[73] Assignee: Mitsubishi Denki Kabushiki Kaisha, Japan

[21] Appl. No.: 312,929

[22] Filed: Feb. 21, 1989

[30] Foreign Application Priority Data

Feb. 23, 1988 [JP] Japan .................................. 63-40001
Nov. 29, 1988 [JP] Japan .................................. 63-302848

[51] Int. Cl.⁴ .............................................. H05K 3/39
[52] U.S. Cl. ...................................... 29/840; 29/412; 29/413; 437/226
[58] Field of Search .................. 29/426.4, 426.5, 412, 29/413, 827, 840; 437/226

[56] References Cited

U.S. PATENT DOCUMENTS

| 4,266,334 | 5/1981 | Edwards et al. | 437/226 X |
| 4,572,757 | 2/1986 | Spadafora | 29/827 X |
| 4,617,729 | 10/1986 | Celnik | 29/840 |

FOREIGN PATENT DOCUMENTS

| 55-55545 | 4/1980 | Japan | 29/412 |
| 55-153350 | 11/1980 | Japan | 29/413 |
| 57-107052 | 7/1982 | Japan | 437/226 |
| 60-94739 | 5/1985 | Japan | 437/226 |
| 59-152638 | 8/1989 | Japan | 437/226 |

OTHER PUBLICATIONS

Ozawa et al., "Micro Hybrid Circuits for Surface Mounting Technology", 1986 IEEE, pp. 10–15.

Primary Examiner—Carl J. Arbes
Attorney, Agent, or Firm—Leydig, Voit & Mayer

[57] ABSTRACT

In a method for manufacturing hybrid integrated circuits, a plurality of circuit patterns are formed on one surface of a board, and a connecting film is stuck onto the other surface of the board. Then, the board is divided into portions having the respective circuit patterns while leaving the connecting film intact and component parts are mounted on the portions. Finally, the individual portions are separated by cutting the connecting film. The circuit patterns may be formed over one surface of the board and covered with a connecting film. The connecting film may be a constituent element of each circuit pattern, such as an insulating layer disposed between conducting layers.

22 Claims, 2 Drawing Sheets

METHOD FOR MANUFACTURING HYBRID INTEGRATED CIRCUITS

BACKGROUND OF THE INVENTION

1. Field of the Invention

The present invention relates to a method for manufacturing hybrid integrated circuits (ICS) and, more particularly, to a method for mounting parts on hybrid integrated circuit boards.

2. Description of the Related Art

After a plurality of circuits such as ICs have been formed on a surface of a silicon wafer by a semiconductor manufacturing process which includes a sequence of process steps such as patterning, ion implantation diffusion, and testing, it has been customary to separate the silicon wafer into individual IC chips in the following manner. As shown in FIG. 1, an adhesive sheet 106 is first applied to the reverse surface 104b of a silicon wafer 104 on which no circuit is formed. The adhesive sheet 106, which is a thin film made of a plastic and coated with an adhesive material, easily undergoes plastic deformation from the application of tensile force. Then, as shown in FIG. 2, grooves 105 for wafer separation are formed along the boundaries between adjacent ICs on the silicon wafer 104 by means of a dicing saw (not shown), the grooves 105 extending from an obverse surface 104a, on which circuits are formed, toward the reverse surface 104b. Each of the grooves 105 is formed to a depth which reaches approximately the mid position of the silicon wafer 104 as viewed in the direction of the thickness thereof.

In addition, as shown in FIG. 1, an elastic sheet 102 having elasticity is carried on a fixed stage 101 made of metal such as stainless steel, and a filter paper 103 is carried on the sheet 102 to protect the obverse surface 104a of the silicon wafer 104. Then, the silicon wafer 104 is carried on the filter paper 103 with the adhesive sheet 106 applied thereto with the surface 104a in contact with the filter paper 103. An aluminum foil 107 having a thickness of some tens of microns is carried on the adhesive sheet 106. In this state, a roller 108 made of stainless steel is rolled over the aluminum foil 107 to apply a downward pressure to the silicon wafer 104. As the roller 108 travels, deformation occurs in the corresponding portion of the sheet 102, and thus the corresponding portion of the silicon wafer 104 is deformed. As a result of the deformation, stresses are concentrated upon the bottom portion of the corresponding groove 105 formed in the silicon wafer 104. Thus, cleavage occurs in the portion of the silicon wafer 104 which extends from the bottom of the groove 105 in the direction of the thickness of the silicon wafer 104, and the adjacent ICs are separated along the cleaved surfaces. In this fashion, as the roller 108 rolls, the silicon wafer is sequentially separated into individual ICs.

Subsequently, the spaces between the adjacent ICs are expanded by applying a tensile force to the adhesive sheet 106, stretching it, and causing plastic deformation of it. Furthermore, the individual ICs are removed from the adhesive sheet 106 and mounted on a circuit board, a lead frame or the like.

However, if the above-described conventional method for separating a silicon wafer is applied to hybrid integrated circuits, the following problems will occur since it is necessary to mount component parts on such a hybrid integrated circuit board. More specifically, if a component part is to be mounted on each separated portion of the circuit board, it is necessary to mount or position each circuit board in place and, hence, the step of mounting parts becomes complicated, thus resulting in an increase in cost. Furthermore, since each separated portion is too small to be easily handled, it is difficult to automate the process for manufacturing hybrid integrated circuits. In contrast, if component parts are mounted prior to wafer separation and the wafer is then separated into individual chips, the following problems occur. When pressure is applied to the board, stresses are applied to the connections of the component parts or the component parts themselves and the reliability of the obtained hybrid integrated circuits may thereby deteriorate. In addition, since various parts are carried on the boards, it is still difficult to automate the process for manufacturing hybrid integrated circuits.

SUMMARY OF THE INVENTION

It is, therefore, an object of the present invention to provide a method for manufacturing hybrid integrated circuits which enables the step of mounting component parts to be simplified and automated and which is capable of manufacturing highly reliable hybrid integrated circuits.

According to one aspect of the present invention, a method for manufacturing hybrid integrated circuits comprises the steps of forming a plurality of circuit patterns on a first surface of a board having a first surface and a second surface which are parallel to each other, applying a connecting film to the second surface of the board, separating the board into portions having the respective circuit patterns without cutting the connecting film, mounting component parts on the first surface of the board which correspond to the portions having the respective circuit patterns, and separating the board into the portions having the respective circuit patterns by cutting the connecting film.

According to another aspect of the present invention, a method for manufacturing hybrid integrated circuits comprises the steps of forming, on a surface of a board, a plurality of circuit patterns, together with a connecting film which covers the circuit patterns to connect each of the circuit patterns to an adjacent one, separating the board into portions having the respective circuit patterns without cutting the connecting film, mounting component parts on the surfaces of the board which correspond to the portions having the respective circuit patterns, and separating the board into the portions having the respective circuit patterns by cutting the connecting film.

DESCRIPTION OF THE PREFERRED EMBODIMENTS

Preferred embodiments of the present invention will be described below with reference to the accompanying drawings.

Figure 3A:
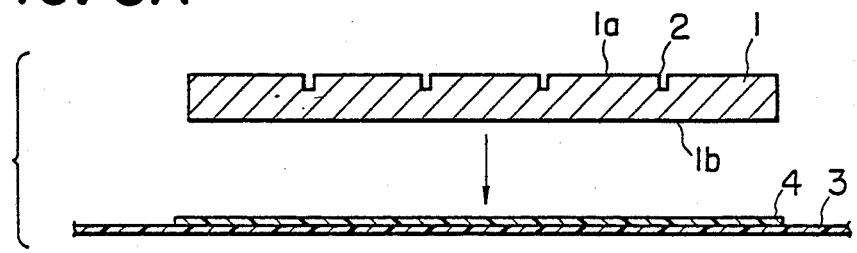
FIGS. 3A to 3E are diagrammatic cross-sectional views illustrating the process steps of a manufacturing method according to a first embodiment of the present invention.

A first embodiment is shown in FIGS. 3A to 3E. First, after a plurality of hybrid integrated circuit patterns have been formed on a 96% alumina ceramic board 1 of 0.8 mm thickness, the boundaries between adjacent circuit patterns are irradiated with a $CO_2$ laser beam from the obverse surface 1a and thus grooves 2 such as those shown in FIG. 3A are formed for the purpose of board separation. The irradiating conditions for the $CO_2$ laser beam in this case are selected so that the grooves 2 may reach approximately the mid portion of the board 1 in the direction of the thickness thereof but may not penetrate through the board 1 to the reverse surface 1b. A polyimide precursor varnish 4 is disposed on a 50 μm thick polyimide film 3 which serves as a heat resistant connecting film.

Figure 3B:
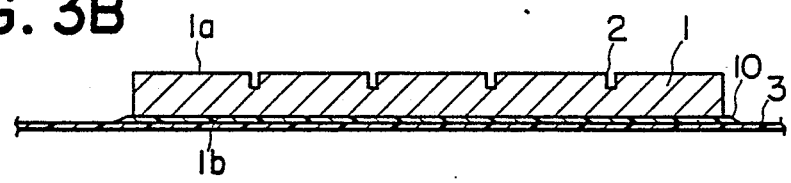

Second, as shown in FIG. 3B, the board 1 is applied to the polyimide precursor varnish 4 coating on the polyimide film 3 with the reverse surface 1b thereof in contact with the polyimide precursor varnish 4. The polyimide precursor varnish 4 is heated to a temperature of 350° C. in a nitrogen atmosphere and thereby hardened to form a polyimide resin 10. Thus, the board 1 and the polyimide film 3 are bonded to each other.

Figure 1:
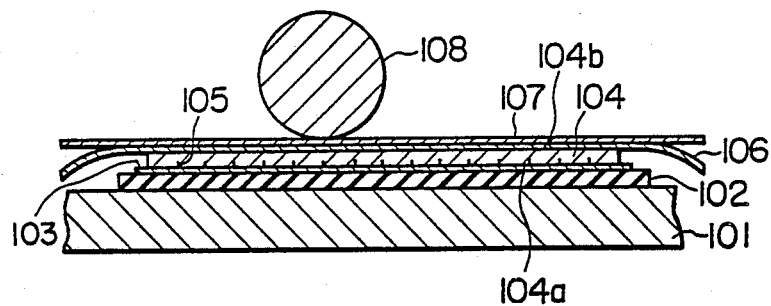
FIGS. 1 and 2 are diagrammatic cross-sectional views illustrating a conventional separation method for effecting separation of a silicon wafer.
Figure 2:
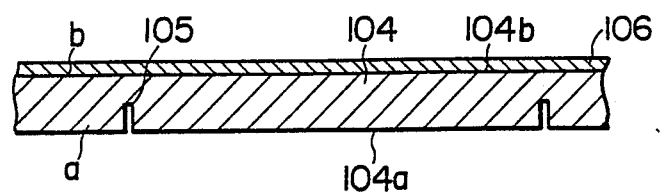
Figure 3C:
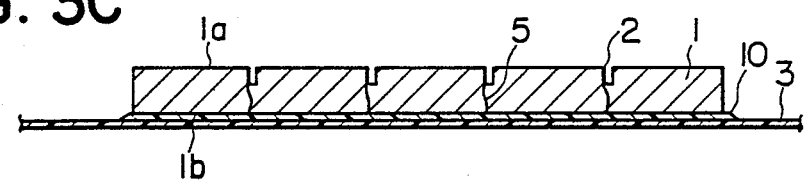

Then, for example, the roller 108 shown in FIG. 1 is used to apply a pressure to the board 1 via the polyimide film 3. Stresses are concentrated at the bottom portion of the corresponding groove 2, stretching the groove 2 under pressure, thereby forming a fissure 5 which, as shown in FIG. 3C, extends from the bottom of the groove 2 to the reverse surface 1b of the board 1. The magnitude of the pressure applied to the board 1 is selected so that the polyimide film 3 remains intact. In this fashion, the board 1 alone is separated into portions, each having a circuit pattern.

Figure 3D:
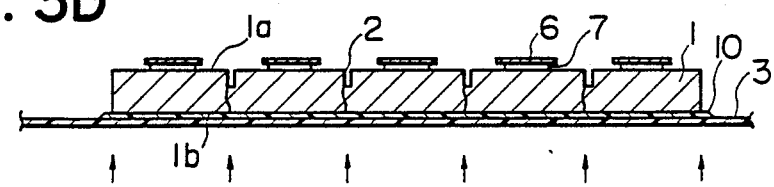
Figure 3E:
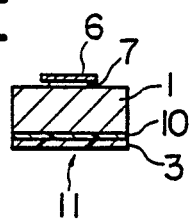

Subsequently, as shown in FIG. 3D, a component part 6 is applied via a solder bead 7 on the obverse surface 1a of each separated portion of the board 1. The solder beads 7 are melted by heating all the separated portions of the board 1, thereby securing the component parts 6 to the respective separated portions. After cooling, a $CO_2$ laser beam is irradiated onto each of the boundaries between the adjacent circuit patterns, as indicated by arrows in FIG. 3D, from the same side as the back of the polyimide film 3, thereby cutting the polyimide film 3 and the polyimide resin 10. Thus, the board 1 is separated into IC chips each having a predetermined circuit pattern together with the polyimide film 3, whereby a hybrid integrated circuit 11 such as that shown in FIG. 3E is obtained.

Figure 4A:
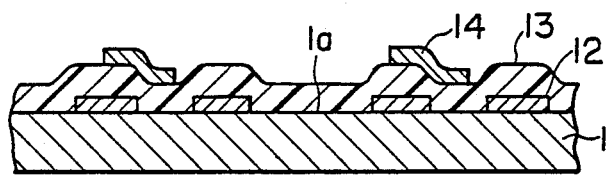
FIGS. 4A to 4C are diagrammatic cross-sectional views illustrating the process steps of a manufacturing method according to a second embodiment of the present invention.
Figure 4B:
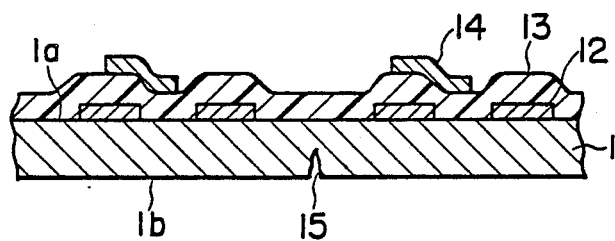
Figure 4C:
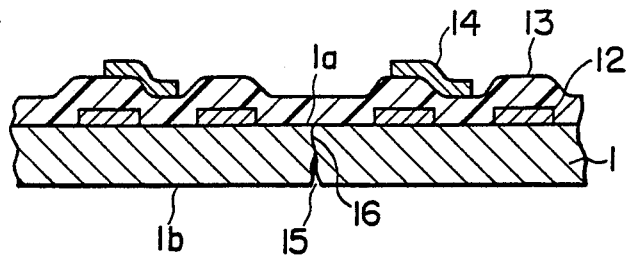

FIGS. 4A to 4C show a method for manufacturing hybrid integrated circuits according to a second embodiment of the present invention. A thick film of silver palladium paste is affixed, by screen process printing, onto the 96% alumina ceramic board 1 having a thickness of 0.8 mm to form a predetermined pattern thereon. Thereafter, as shown in FIG. 4A, a silver palladium conductor 12 is formed by baking it at a temperature of 850° C. in air. Second, a polyimide precursor varnish of fixed thickness is applied the obverse surface 1a of the board 1 and the silver palladium conductor 12. After drying, patterning is effected onto the polyimide precursor varnish by a photolithographic process to expose the portions of the silver palladium conductor 12 which are to be connected to an upper conductor layer (not shown).

Subsequently, a reaction to convert the polyimide precursor varnish into an imide compound is accelerated by heating at a temperature of 350° C. for one hour in a nitrogen atmosphere, thereby forming a polyimide film 13. After a copper film has been formed over the polyimide film 13 by vacuum deposition, a predetermined pattern is formed in the copper film by a photolithographic process to provide a copper layer 14.

In this fashion, a plurality of hybrid integrated circuit patterns are formed on the board 1 at the same time, but the polyimide film 13 is also formed over the obverse surface 1a of the board 1 to cover all the hybrid integrated circuit patterns.

Then, a $CO_2$ laser beam is irradiated onto each of the portions of the reverse surface 1b which correspond to the boundaries between the adjacent hybrid integrated circuit patterns, and thus grooves 15 (one of them is shown in FIG. 4B) are formed. The irradiating conditions for the $CO_2$ laser beam in this case are selected so that the grooves 15 reach approximately the mid portion of the board 1 in the direction of the thickness thereof but do not penetrate through the board 1 to the obverse surface 1a.

Then, for example, the roller 108 shown in FIG. 1 is used to apply a pressure to the board 1 via the polyimide film 13 to concentrate stresses upon the bottom portion of the corresponding groove 15 to stretch the groove 15 under pressure, thereby forming a fissure 16 which, as shown in FIG. 4C, extends from the bottom of the groove 15 to the obverse surface 1a of the board 1. The magnitude of the pressure applied to the board 1 is determined so that the polyimide film 13 remains intact. In this fashion, the board 1 alone is separated into portions each having a circuit pattern.

Subsequently, a component part (not shown) is mounted via a solder bead (not shown) on the obverse surface 1a of each separated portion of the board 1, and the solder beads are melted by heating all the separated portions of the board 1, thereby securing the component parts to the respective separated portions. Then, a $CO_2$ laser beam is irradiated onto each of the boundaries between the adjacent circuit patterns from the same side as the polyimide film 13, thereby cutting the polyimide film 13. Thus, the board 1 is separated into IC chips each having a predetermined circuit pattern together with the polyimide film 13, whereby separate hybrid integrated circuits are obtained.

It will be appreciated from the foregoing that each of the first and second embodiments has the following advantages. Since the separation of the board 1 is carried out before the component parts are placed on the board 1, the component parts or the connections thereof are not adversely affected during separation. Since the separated portions of the board 1 are connected by the polyimide film 3 or 13 and, in this state, the component parts are mounted on the respective separated portions, the process for mounting the component parts is simplified. In consequence, it is possible to easily automate the process for manufacturing hybrid integrated circuits.

In addition, the second embodiment provides the following advantage. Since the polyimide film 13 which is one constituent element of each of the hybrid integrated circuit patterns, connects the separated portions of the board 1, it is not necessary to stick an exclusive connecting film to the board 1. Accordingly, the total number of process steps decreases and, therefore, the manufacturing cost is reduced.

Although each of the first and second embodiments is described with illustrative reference to the alumina ceramic board, similar effects and advantages can also be achieved by using materials of any kind that can be separated by forming separating grooves and causing stress concentration therealong. For example, it is possible to use an aluminum nitride board. In addition, although such separating grooves are formed for the convenience of board separation, the board may be separated without forming any separating grooves.

In each of the first and second embodiments, the heat resistant polyimide film is used as a connecting film for the purpose of illustration, but the connecting film is not limited to polyimide. For example, it is possible to use a metal foil or a heat resistant polymer film of any type that can withstand heat generated during a soldering process. It is preferable to use a flexible material. In place of the polyimide precursor varnish, a heat resistant epoxy resin, a triazinebismaleide-type resin or the like may be employed.

Furthermore, the connecting film may be cut by the method other than a $CO_2$ laser, for example, mechanical cutting using a cutter.

What is claimed is:

1. A method for manufacturing hybrid integrated circuits comprising the steps of:
   forming a plurality of circuit patterns on a first surface of a board having opposed first and second surfaces;
   applying a connecting film to said second surface of said board;
   dividing said board into portions by forming grooves in said board on said first side, each portion including one of said circuit patterns thereon, while leaving said connecting film intact;
   mounting component parts on said first surface of said board on said respective portions; and
   separating said portions having said component parts mounted thereon by cutting said connecting film.

2. A method according to claim 1 wherein dividing said board includes applying pressure to said second side of said board to fracture said board at said grooves.

3. A method according to claim 2 wherein forming said grooves includes irradiating said first side of said board with a laser beam.

4. A method according to claim 1 wherein said board is an alumina ceramic.

5. A method according to claim 1 wherein said board is aluminum nitride.

6. A method according to claim 1 including mounting said component parts on said board by soldering.

7. A method according to claim 1 wherein said connecting film is polyimide.

8. A method according to claim 1, wherein said connecting film is a metal foil.

9. A method according to claim 1, including cutting said connecting film by irradiating said connecting film with a laser beam.

10. A method according to claim 1 including mechanically cutting said connecting film.

11. A method for manufacturing hybrid integrated circuits comprising the steps of:
    forming on a first surface of a board having opposed first and second sides, a plurality of circuit patterns and a connecting film covering said circuit patterns;
    dividing said board into portions by forming grooves in said board on said second side, each portion including one of said circuit patterns thereon, while leaving said connecting film intact;
    mounting component parts on said respective portions; and
    separating said portions having said component parts mounted thereon by cutting said connecting film.

12. A method according to claim 11 wherein dividing said board includes applying pressure to said first side of said board to fracture said board at said grooves.

13. A method according to claim 11 wherein forming said grooves includes irradiating said first side of said board with a laser beam.

14. A method according to claim 11 wherein said board is an alumina ceramic.

15. A method according to claim 11, wherein said board is aluminum nitride.

16. A method according to claim 11 wherein said connecting film is one constituent element of each of said circuit patterns.

17. A method according to claim 16, wherein said connecting film is an electrically insulating film.

18. A method according to claim 17 wherein said connecting film is an organic polymer film.

19. A method according to claim 11 including mounting said component parts on said board by soldering.

20. A method according to claim 18, wherein said connecting film is polyimide.

21. A method according to claim 11 including cutting said connecting film by irradiating said connecting film with a laser beam.

22. A method according to claim 11 including mechanically cutting said connecting film.

* * * * *